United States Patent
Choi et al.

(10) Patent No.: US 7,491,597 B2
(45) Date of Patent: Feb. 17, 2009

(54) FLASH MEMORY DEVICE CAPABLE OF ERASING FLASH BLOCKS IN SOI SUBSTRATE BASED ON BACK-BIAS, METHOD FOR MANUFACTURING THE SAME, AND FLASH BLOCK ERASION METHOD AND STRUCTURE THEREOF

(75) Inventors: Yang-Kyu Choi, Daejeon (KR); Hyunjin Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 394 days.

(21) Appl. No.: 11/380,347

(22) Filed: Apr. 26, 2006

(65) Prior Publication Data

US 2006/0246660 A1 Nov. 2, 2006

(30) Foreign Application Priority Data

Apr. 27, 2005 (KR) .................... 10-2005-0035142

(51) Int. Cl.
 *H01L 21/8238* (2006.01)
(52) U.S. Cl. ................ 438/201; 438/211; 257/E21.179
(58) Field of Classification Search ................. 438/201, 438/211, 257, 593; 257/E21.179, E21.422, 257/E21.68
See application file for complete search history.

(56) References Cited

U.S. PATENT DOCUMENTS 6,424,011 B1* 7/2002 Assaderaghi et al. ........ 257/350

* cited by examiner

*Primary Examiner*—Hoai v Pham
(74) *Attorney, Agent, or Firm*—Abelman Frayne & Schwab; Harry K. Ahn

(57) ABSTRACT

Provided is a flash memory, and more particularly, to a method and structure for erasing flash blocks based on back-bias. The method comprises the steps of forming a flash block on a silicon on insulator (SOI) substrate and forming a body-electrode on back side of the silicon on insulator (SOI) substrate.

7 Claims, 5 Drawing Sheets

US 7,491,597 B2

FLASH MEMORY DEVICE CAPABLE OF ERASING FLASH BLOCKS IN SOI SUBSTRATE BASED ON BACK-BIAS, METHOD FOR MANUFACTURING THE SAME, AND FLASH BLOCK ERASION METHOD AND STRUCTURE THEREOF

This Nonprovisional application claims priority under 35 U.S.C. § 119(a) on Patent Application No. 10-2005-0035142 filed in Korea on Apr. 27, 2005, the entire contents of which are hereby incorporated by reference.

BACKGROUND OF THE INVENTION

1. Field of the Invention

The present invention relates to a flash memory, and more particularly, to a method for erasing flash blocks based on back-bias, and a structure thereof.

2. Description of the Background Art

While Dynamic Random Access Memory (DRAM) or Static RAM (SRAM) lose data when power turned off, flash memory has the advantage of Read Only Memory (ROM) that maintains stored data even when the power is off and the advantage of RAM that can input and output data. Thus, flash memory is called non-volatile memory.

Since non-volatile memory can be highly integrated just as DRAM and it has an excellent data preservation property, it can be used as an auxiliary memory in a system and it has a wide range of applications, such as data storage including personal electronic communication devices, digital cameras, Moving Picture Experts Group Audio Level 3 (MP3) players, and memory cards which require mobility and portability.

When the flash device is formed by using a silicon-on-insulator (SOI) substrate, there are advantages such as devices can be easily isolated, the area of each flash device can be reduced, and a short-channel effect caused by reduced channel length of each flash device can be reduced.

Particularly, SOI technology which makes it possible to manufacture an ultra fine transistor having a double gate, a tri-gate, or a gate array, such as FinFET, is essential for the manufacturing of tera-bit flash memory devices going beyond sub-40 nm level.

However, since the SOI substrate does not have a silicon substrate connected to a channel, there is a shortcoming that it cannot use conventional Fowler-Nordheim (F-N) tunneling which collectively erases data through block erasion and sector erasion by supplying high-voltage to a well.

SUMMARY OF THE INVENTION

Accordingly, an object of the present invention is to solve at least the problems and disadvantages of the background art.

It is an object of the present invention to provide a method for manufacturing a flash memory device that has a high reproducibility and performs re-flash through a simple process by using a silicon-on-insulator (SOI) substrate.

It is another object of the present invention to provide a method for manufacturing a small flash memory device by using an SOI substrate.

According to an aspect of the present invention, provided is a method of manufacturing a flash memory device. The method comprises forming a flash block on a silicon on insulator (SOI) substrate and forming a body-electrode on back side of the silicon on insulator (SOI) substrate.

The SOI substrate comprises a silicon substrate and an insulating film, and the doping concentration of the silicon substrate is more than $10^{17}$ cm$^{-3}$.

The SOI substrate comprises a silicon substrate and an insulating film, and the insulating film is thinner than 0.1 μm.

The method of manufacturing a flash memory device further comprises depositing a passivation oxide layer.

The flash block is formed as one of a floating-type, a silicon-oxide-nitride-oxide-silicon (SONOS), or a metal-oxide-nitride-oxide-silicon (MONOS).

According to another aspect of the present invention, provided is a flash memory device. The flash memory device comprises a silicon on insulator (SOI) substrate, a flash block formed on the SOI substrate and a body-contact formed on back side of the SOI substrate.

The SOI substrate comprises a silicon substrate and an insulating film, and the doping concentration of the silicon substrate is more than $10^{17}$ cm$^{-3}$.

The SOI substrate comprises a silicon substrate and an insulating film, and the insulating film is thinner than 0.1 μm.

The flash memory device further comprises a passivation oxide layer deposited on the SOI substrate.

The flash block is formed as one of a floating-type, a silicon-oxide-nitride-oxide-silicon (SONOS), or a metal-oxide-nitride-oxide-silicon (MONOS).

The flash block comprises a control gate, a gate oxide film, and a floating gate.

According to another aspect of the present invention, provided is a method of manufacturing a flash memory. The method comprises forming a silicon on insulator (SOI) substrate and a body-contact implantation (B.C.I) mask pattern, forming a body-contact implantation (B.C.I) area by applying an impurity to the SOI substrate using the B.C.I mask pattern, removing the B.C.I mask pattern and performing an annealing, forming a flash block on the SOI substrate and depositing a passivation oxide layer, forming a body-contact (B.C) mask on top of the passivation oxide layer and forming a contact hole by using the B.C mask and forming a body-contact in the contact hole.

The SOI substrate comprises a silicon substrate and an insulating film, and the insulating film is thinner than 0.1 μm.

The SOI substrate comprises a silicon substrate and an insulating film, and the doping concentration of the silicon substrate is more than $10^{17}$ cm$^{-3}$.

The flash block is formed as one of a floating type, a silicon-oxide-nitride-oxide-silicon (SONOS), or a metal-oxide-nitride-oxide-silicon (MONOS).

The flash block comprises a control gate, a gate oxide film, and a floating gate.

The SOI substrate comprises a silicon substrate and an insulating film, and when the silicon substrate is formed as a P-well, a N+ impurity is injected to the silicon substrate.

The SOI substrate comprises a silicon substrate and an insulating film, and when the silicon substrate is formed as an N-well, a P+ impurity is injected to the silicon substrate.

According to another aspect of the present invention, provided is a flash memory device. The flash memory device comprises a silicon on insulator (SOI) substrate comprising a silicon substrate including body-contact implantation (B.C.I) area and an insulating film, a flash block is formed on the SOI substrate, a passivation oxide film is formed on the SOI substrate to protect the flash block and a body-contact formed in a hall which is formed in the inside of both the passivation oxide film and the insulating film.

The insulating film is thinner than 0.1 μm.

The doping concentration of the silicon substrate is more than $10^{17}$ cm$^{-3}$.

An N+ impurity is injected to the B.C.I area of the silicon substrate when the silicon substrate is formed as a P-well.

A P+ impurity is injected to the B.C.I area of the silicon substrate when the silicon substrate is formed as an N-well.

The flash block is formed as one of a floating type, silicon-oxide-nitride-oxide-silicon (SONOS), or metal-oxide-nitride-oxide-silicon (MONOS).

The flash block comprises a control gate, a gate oxide film, and a floating gate.

Details of other embodiments are included in the detailed description and drawings of the present specification.

BRIEF DESCRIPTION OF THE DRAWINGS

The invention will be described in detail with reference to the following drawings in which like numerals refer to like elements.

DETAILED DESCRIPTION OF PREFERRED EMBODIMENTS

Preferred embodiments of the present invention will be described in a more detailed manner with reference to the drawings.

The advantages and objects of the present invention and a method achieving the objects will be clearly understood by referring to the following embodiments which are described with reference to the accompanying drawings. However, it will be apparent to those skilled in the art that various changes and modifications may be made without departing from the scope of the invention as defined in the following claims. The present invention is only defined by the scope of claims in the present specification. Herein, the same reference number is given to the same constituent element throughout the specification although it appears in different drawings.

Hereinafter, preferred embodiments of the present invention will be described in detail with reference to the accompanying drawings.

FIGS. 1A to 1D are cross-sectional views with regard to a process for manufacturing a flash memory according to an embodiment of the present invention.

Figure 1A:
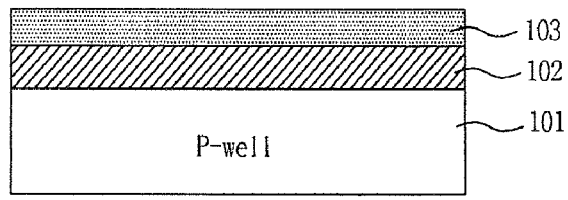
FIGS. 1A to 1D are cross-sectional views with regard to a process for manufacturing a flash memory according to an embodiment of the present invention.

Referring to FIG. 1A, a silicon substrate 101, a lower insulating film 102, and a silicon layer 103 are formed sequentially. This silicon/insulating file/silicon structure is called a silicon-on-insulator (SOI) substrate.

When the silicon substrate 101 is doped in a high doping concentration or the thickness of the insulating film 102 is low, the back-bias voltage required to erase data stored in a flash block decreases. In an embodiment of the present invention, it is desirable that the doping concentration of the silicon substrate 101 is more than $10^{17}$ cm$^{-3}$ and the thickness of the lower insulating film 102 is less than 0.1 μm.

In other words, the higher the doping concentration of the silicon substrate 101, the more the resistance decreases, and, thus, the required back-bias voltage decreases.

The back-bias voltage which is applied to the body-contact 106 formed in the lower part of the silicon substrate 101 falls down in the lower insulating film 102 and, then, is applied to the silicon layer 103. Thus, the thinner the lower the insulating film 102 is, the less back-bias voltage is required to erase data stored in the flash blocks 104.

Figure 1B:
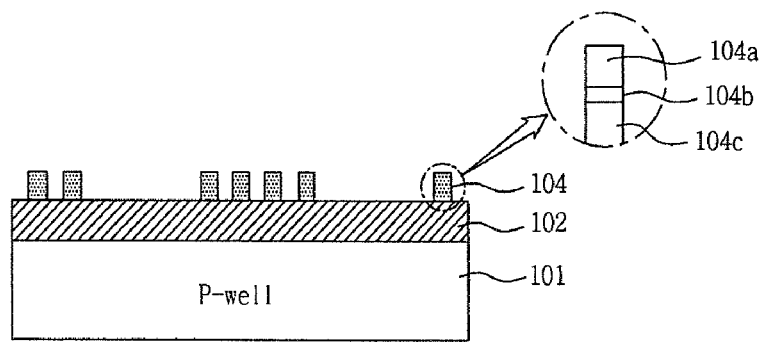

Referring to FIG. 1B, flash blocks 104 comprising a control gate 104a, a gate oxide film 104b, and a floating gate 104c are formed. In this embodiment, the flash blocks 104 may be implemented as a floating type. However, the flash blocks 104 have diverse types, such as a silicon-oxide-nitride-oxide-silicon (SONOS), metal oxide nitride oxide silicon (MONOS).

Figure 1C:
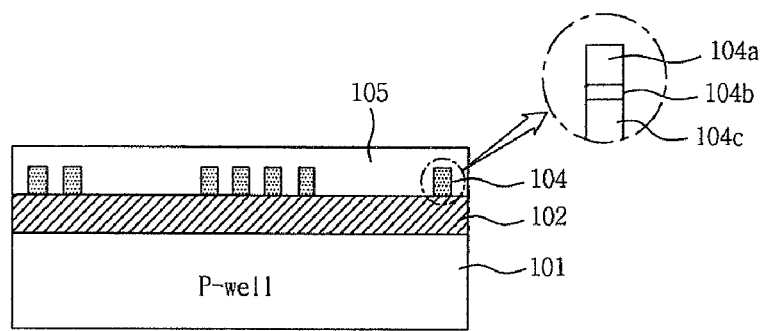
Figure 1D:
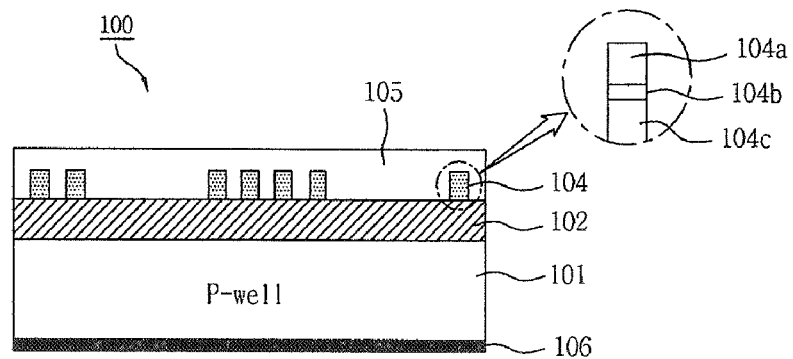

Referring to FIG. 1C, a passivation oxide layer 105 is deposited to protect the flash blocks 104. Next, referring to FIG. 1D, a body-electrode 106 is formed on the back side of the silicon substrate 101.

When the high back-bias voltage is applied to the body-contact 106 formed in the lower surface of the silicon substrate 101 and 0[V] is applied to the control gate 104a, F-N tunneling current is generated in the gate oxide film 104b and electrons flow from the floating gate 104c to the silicon substrate 101. Accordingly, a data stored in the flash blocks 104 is erased.

In this embodiment, it is desirable that the high back-bias voltage is 10[V]. However, the back-bias voltage can be changed according to a thickness of the lower insulating film 102, a concentration of the silicon substrate 101, or a characteristic of the flash block 104.

FIGS. 2A to 2G are cross-sectional views with regard to a process for manufacturing a flash memory according to another embodiment of the present invention.

Figure 2A:
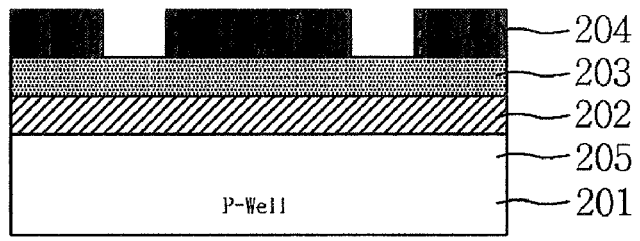
FIGS. 2A to 2G are cross-sectional views with regard to a process for manufacturing a flash memory according to another embodiment of the present invention.

Referring to FIG. 2A, a silicon substrate 201, a lower insulating film 202, a silicon layer 203, and a body-contact implantation (B.C.I) mask pattern 204 are formed sequentially. The structure comprising the silicon substrate 201, the lower insulating film 202, and a silicon layer is called as a silicon on insulator (SOI) substrate.

The B.C.I mask pattern 204 is formed by using a photoresist process.

Preferably, the lower insulating film is thinner than 0.1 μm. The thinner the lower insulating film is, the less back-bias voltage to erase flash blocks becomes.

Figure 2B:
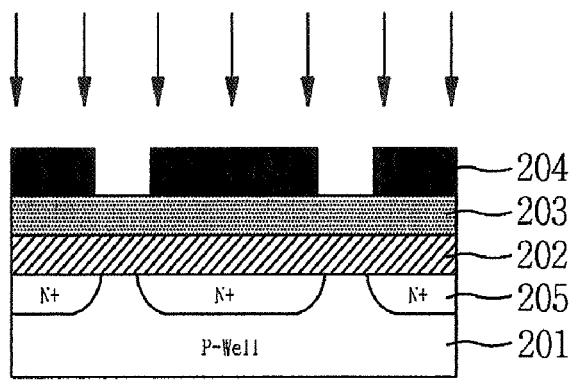

Subsequently, referring FIG. 2B, N+ impurity having a high level of energy is injected into a P-well of the silicon substrate 201 for body-contacts by using the B.C.I mask pattern 204. Consequently, a body-contact implantation (B.C.I) area 205 is formed.

The high level of energy required for the N+ impurity insertion means a level of energy high enough to inject the impurity into the P-well of the silicon substrate 201 under the lower insulating film. The level of energy is different according to the kind of injected impurity and the thickness of the silicon layer 203 and the lower insulating film 202.

The B.C.I regions 205 with the impurity injected thereto are isolated from each other due to step height between the B.C.I mask pattern 204 and the silicon layer 203.

Figure 2C:
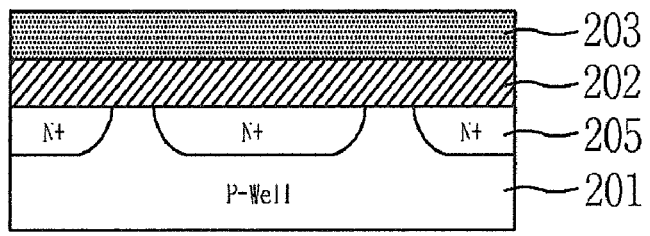

Subsequently, referring to the FIG. 2C, the B.C.I mask pattern 204 is removed and annealing occurs.

Figure 2D:
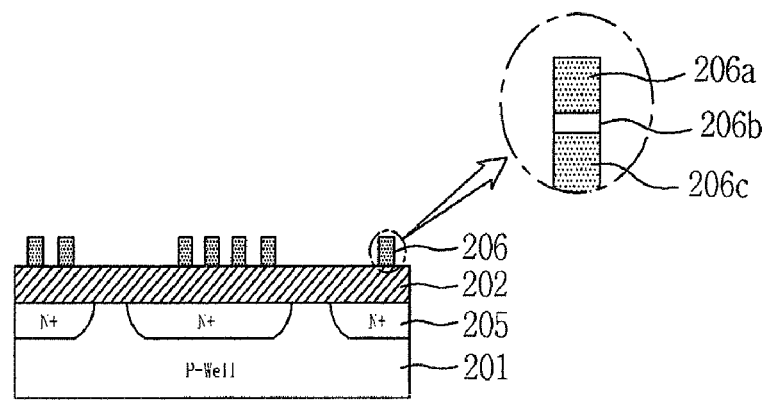

Next, referring to the FIG. 2D, flash blocks 206 are formed on the lower insulating film 202. The flash blocks 206 comprise a control gate 206, a gate oxide film 206b, and a floating gate 206c.

In this embodiment, the flash blocks are implemented as a floating type. However, the flash blocks 206 are formed in diverse forms, such as a SONOS and a MONOS.

Figure 2E:
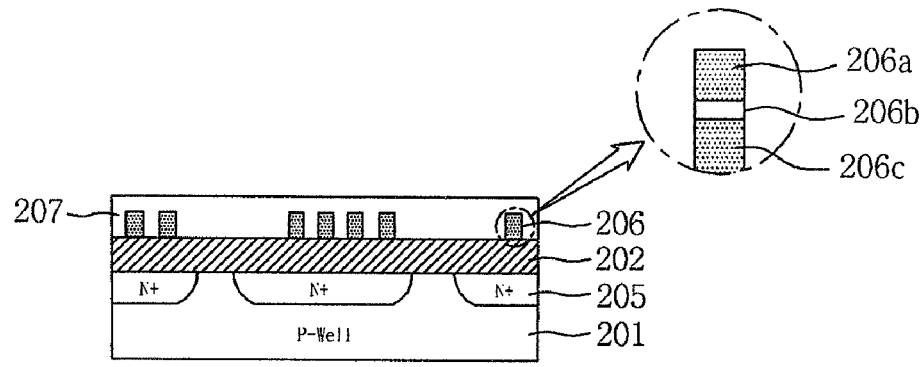

Referring to FIG. 2E, a passivation oxide layer 207 is deposited to protect the flash block 206.

Figure 2F:
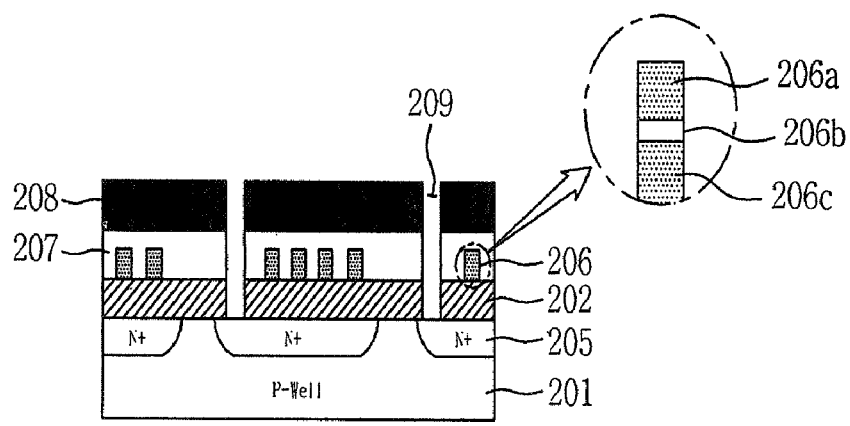

Referring to FIG. 2F, contact holes 209 are formed by using a body-contact (B.C) mask 208.

Figure 2G:
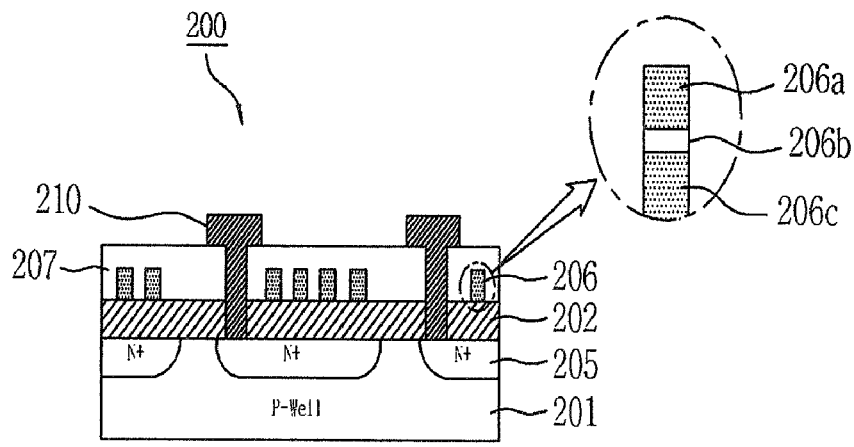

Subsequently, referring to FIG. 2G, body-contacts 210 are formed through metal deposition or patterning.

When a high back-bias voltage is applied to the body-contact 210 of the flash memory 200, 0[V] is applied to the control gate 206a, and the back bias voltage is applied to the B.C.I areas 205, F-N tunneling current is generated in the gate oxide film 206b and electrons flow from the floating gate 206c to the silicon substrate 201. Accordingly, data stored in the flash blocks 206 is erased.

FIGS. 3A to 3G are cross-sectional views with regard to a process for manufacturing a flash memory according to still another embodiment of the present invention.

Figure 3A:
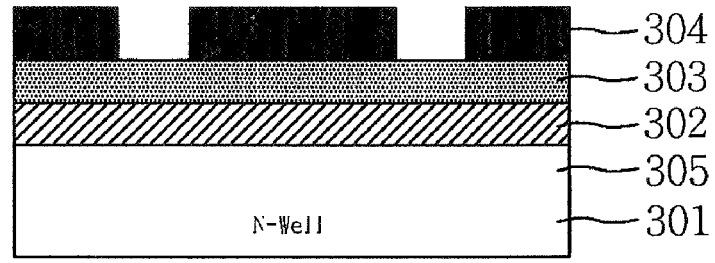
FIGS. 3A to 3G are cross-sectional views with regard to a process for manufacturing a flash memory according to still another embodiment of the present invention.

Referring to FIG. 3A, a silicon substrate 301, a lower insulating film 302, a silicon layer 303, and a B.C.I. mask pattern 304 are formed sequentially.

In this embodiment, the silicon substrate 301 is formed as N-well, and the B.C.I. mask pattern 304 is formed by using a photoresist process.

Preferably, the lower insulating film is thinner than 0.1 μm to decrease the back-bias voltage required to erase data stored in flash blocks 306 (see FIGS. 3D to 3G).

In other words, the back-bias voltage which is applied to the silicon substrate 301 falls down in the lower insulating film 302 and, then, is applied to the silicon layer 303. Thus, the thinner the lower the insulating film 302 is, the less the back-bias voltage is required to erase data stored in the flash blocks 306 (see FIGS. 3D to 3G).

Figure 3B:
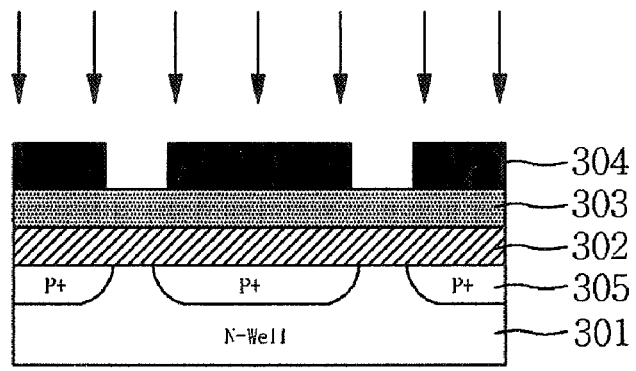

Subsequently, referring to FIG. 3B, P+ impurity having a high level of energy is injected into an N-well of the silicon substrate 301 for body-contacts by using the B.C.I mask pattern 304. Consequently, body-contact implantation (B.C.I) areas 305 are formed.

The high level of energy needed in the P+ impurity insertion means a level of energy high enough to inject the impurity into the N-well of the silicon substrate 301 under the lower insulating film 302. The level of energy required differs according to the kind of injected impurity and the thickness of the silicon layer 303 and the lower insulating film 302.

The B.C.I regions 305 with the impurity injected thereto are isolated from each other due to step height between the B.C.I mask pattern 304 and the silicon layer 303.

Figure 3C:
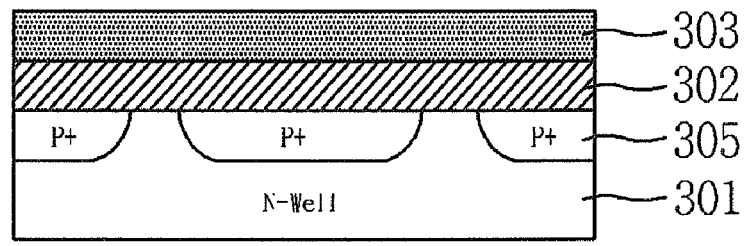

Subsequently, referring to FIG. 3C, the B.C.I mask pattern 304 is removed and annealing is carried out.

Figure 3D:
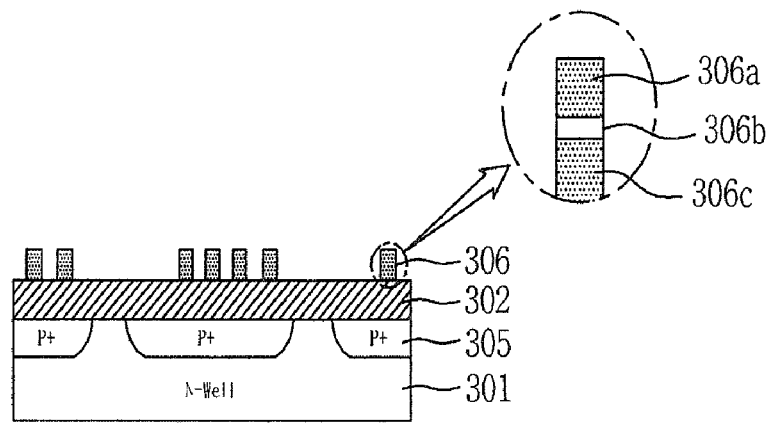

Next, referring to FIG. 3D, flash blocks 306 are formed on the lower insulating film 302. The flash blocks 306 comprise a control gate 306a, a gate oxide film 306b, and a floating gate 306c.

In this embodiment, the flash blocks 306 are implemented as a floating type. However, the flash blocks 306 are formed in diverse forms, such as a SONOS and a MONOS.

Figure 3E:
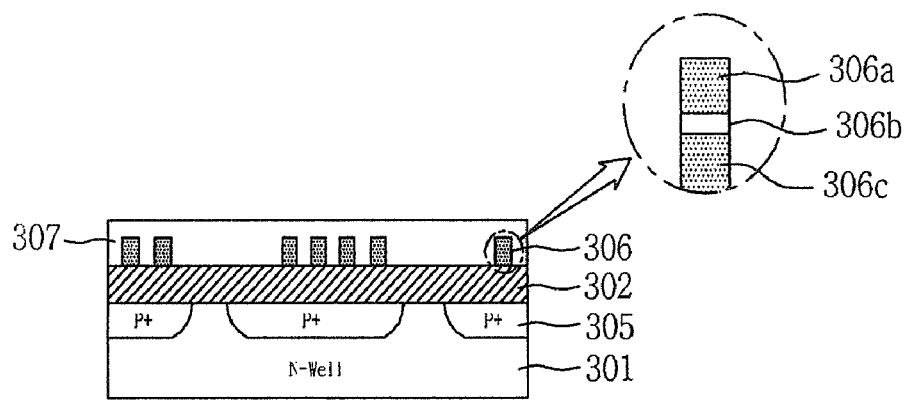

Referring to FIG. 3E, a passivation oxide layer 307 is deposited to protect the flash bocks 306.

Figure 3F:
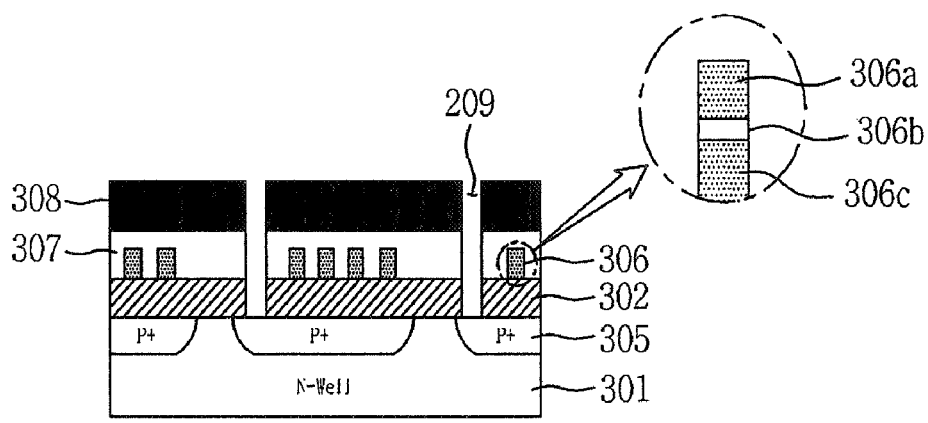

Referring to FIG. 3F, contact holes 309 are formed by using a body-contact (B.C.) mask 308.

Figure 3G:
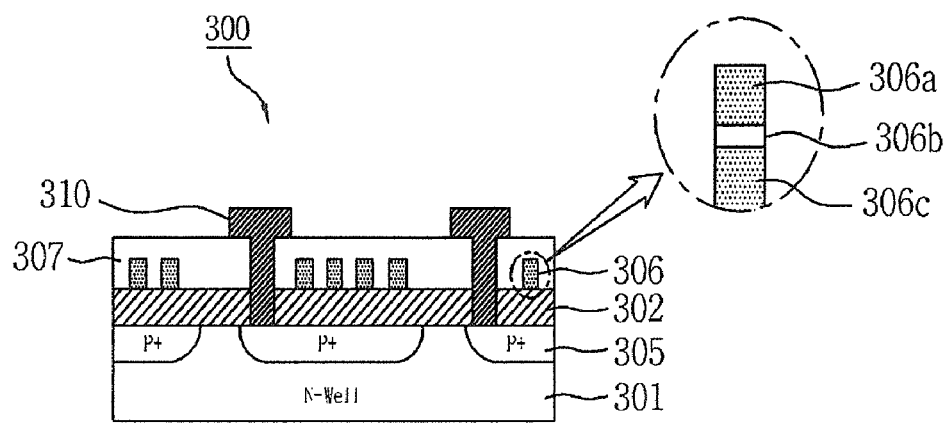

Subsequently, referring to FIG. 3G, body-contacts 310 are formed through metal deposition or patterning.

When a high back-bias voltage is applied to the body-contact 310 of the flash memory 300, 0[V] is applied to the control gate 306a, and the back bias voltage is applied to the B.C.I areas 305, F-N tunneling current is generated in the gate oxide film 306b and electrons flow from the floating gate 306c to the silicon substrate 301. Accordingly, data stored in the flash blocks 306 is erased.

According to the present invention described above, a flash memory device that can perform re-flash with a high reproducibility in a simple manner can be manufactured by using the SOI substrate. Also, with the SOI substrate, it is possible to manufacture a small flash memory device.

The invention being thus described may be varied in many ways. Such variations are not to be regarded as a departure from the spirit and scope of the invention and all such modifications as would be obvious to one skilled in the art are intended to be included within the scope of the following claims.

What is claimed is:

1. A method of manufacturing a flash memory comprising;
   Forming a silicon on insulator (SOI) substrate and a body-contact implantation (B.C.I) mask pattern;
   Forming a body-contact implantation (B.C.I) area by applying an impurity to the SOI substrate using the B.C.I mask pattern;
   Removing the B.C.I mask pattern and performing an annealing;
   Forming a flash block on the SOI substrate and depositing a passivation oxide layer;
   Forming a body-contact (B.C) mask on top of the passivation oxide layer and forming a contact hole by using the B.C mask; and
   Forming a body-contact in the contact hole.

2. The method of claim 1, wherein the SOI substrate comprises a silicon substrate, an insulating film, and a silicon layer, and the insulating film is thinner than 0.1 μm.

3. The method of claim 1, wherein the SOI substrate comprises a silicon substrate and an insulating film, and the doping concentration of the silicon substrate is more than $10^{17}$ cm$^{-3}$.

4. The method of claim 1, wherein the flash block is formed as one of a floating type, a silicon-oxide-nitride-oxide-silicon (SONOS), or a metal-oxide-nitride-oxide-silicon (MONOS).

5. The method of claim 1, wherein the flash block comprises a control gate, a gate oxide film, and a floating gate.

6. The method of claim 1, wherein the SOI substrate comprises a silicon substrate and an insulating film, and when the silicon substrate is formed as a P-well, an N+ impurity is injected to the silicon substrate.

7. The method of claim 1, wherein the SOI substrate comprises a silicon substrate and an insulating film, and when the silicon substrate is formed as an N-well, a P+ impurity is injected to the silicon substrate.

* * * * *